(12) United States Patent
Prest et al.

(10) Patent No.: US 8,568,184 B2
(45) Date of Patent: Oct. 29, 2013

(54) DISPLAY MODULES

(75) Inventors: Christopher D. Prest, San Francisco, CA (US); Stephen P. Zadesky, Portola Valley, CA (US); David A. Pakula, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 670 days.

(21) Appl. No.: 12/608,928

(22) Filed: Oct. 29, 2009

(65) Prior Publication Data

US 2011/0012873 A1 Jan. 20, 2011

Related U.S. Application Data

(60) Provisional application No. 61/225,870, filed on Jul. 15, 2009.

(51) Int. Cl.
*H01J 9/26* (2006.01)

(52) U.S. Cl.
USPC .......................... 445/25; 313/512

(58) Field of Classification Search
USPC ............ 257/40, 72, 98–100, 642–643, 759; 313/498–512; 315/169.1, 169.3; 427/58, 64, 66, 532–535, 539; 428/690–691, 917; 438/26–29, 34, 82, 438/455; 445/24–25
See application file for complete search history.

(56) References Cited

U.S. PATENT DOCUMENTS

| | | | |
|---|---|---|---|
| 3,868,676 A * | 2/1975 | Hennessey et al. | 345/43 |
| 3,872,339 A * | 3/1975 | Maloney | 313/584 |
| 4,839,557 A * | 6/1989 | Schrank | 313/509 |
| 6,127,005 A * | 10/2000 | Lehman et al. | 427/553 |
| 6,245,699 B1 * | 6/2001 | Hudecek et al. | 501/18 |
| 6,631,022 B1 * | 10/2003 | Kihira et al. | 359/265 |
| 6,929,524 B2 * | 8/2005 | Ando | 445/24 |
| 6,936,407 B2 | 8/2005 | Pichler | |
| 7,407,839 B2 * | 8/2008 | Akiyama et al. | 438/149 |
| 2006/0001761 A1 | 1/2006 | Haba | |
| 2006/0284556 A1 | 12/2006 | Tremel | |
| 2007/0002257 A1 | 1/2007 | Oh | |
| 2007/0091062 A1 | 4/2007 | French | |
| 2007/0173167 A1 * | 7/2007 | Choi | 445/25 |
| 2007/0273281 A1 * | 11/2007 | Biebel | 313/512 |
| 2008/0150419 A1 | 6/2008 | Kang | |
| 2008/0171485 A1 | 7/2008 | Choi et al. | |

(Continued)

FOREIGN PATENT DOCUMENTS

| | | |
|---|---|---|
| DE | 10 2005 044523 | 3/2007 |
| JP | 2003217833 | 7/2003 |

(Continued)

*Primary Examiner* — Donald Raleigh
(74) *Attorney, Agent, or Firm* — Treyz Law Group; Nancy Y. Ru; Jennifer Luh

(57) ABSTRACT

An electronic device may have a display. The display may have active components such as display pixels formed on a display substrate layer. The display substrate layer may be formed from a glass substrate layer. Thin-film transistors and other components for the display pixels may be formed on the glass substrate. An encapsulation glass layer may be bonded to the glass substrate using a ring-shaped bond structure. The ring-shaped bond structure may extend around the periphery of the encapsulation glass layer and the substrate glass layer. The bond structure may be formed from a glass frit, a solid glass ring, integral raised glass portions of the glass layers, meltable metal alloys, or other bond materials. Chemical and physical processing operations may be used to temper the glass layers, to perform annealing operations, to preheat the glass layers, and to promote adhesion.

11 Claims, 13 Drawing Sheets

(56) References Cited

U.S. PATENT DOCUMENTS

| | | |
|---|---|---|
| 2008/0231176 A1 | 9/2008 | Lee |
| 2008/0297042 A1 | 12/2008 | Ahn et al. |
| 2008/0305706 A1* | 12/2008 | Nonomura et al. ............. 445/24 |
| 2009/0059341 A1* | 3/2009 | Kinugawa et al. ............ 359/245 |
| 2009/0069164 A1* | 3/2009 | Lamberson et al. ............ 501/15 |
| 2009/0086325 A1* | 4/2009 | Liu et al. ....................... 359/599 |
| 2009/0148682 A1 | 6/2009 | Higuchi |
| 2009/0218932 A1* | 9/2009 | Wang ............................ 313/504 |
| 2009/0221207 A1* | 9/2009 | Russell et al. .................. 445/25 |
| 2010/0270919 A1* | 10/2010 | Hubert et al. ................. 313/512 |

FOREIGN PATENT DOCUMENTS

| | | |
|---|---|---|
| WO | 2006110145 | 10/2006 |
| WO | 2007/067402 | 6/2007 |
| WO | WO 2009086228 A1 * | 7/2009 |

* cited by examiner

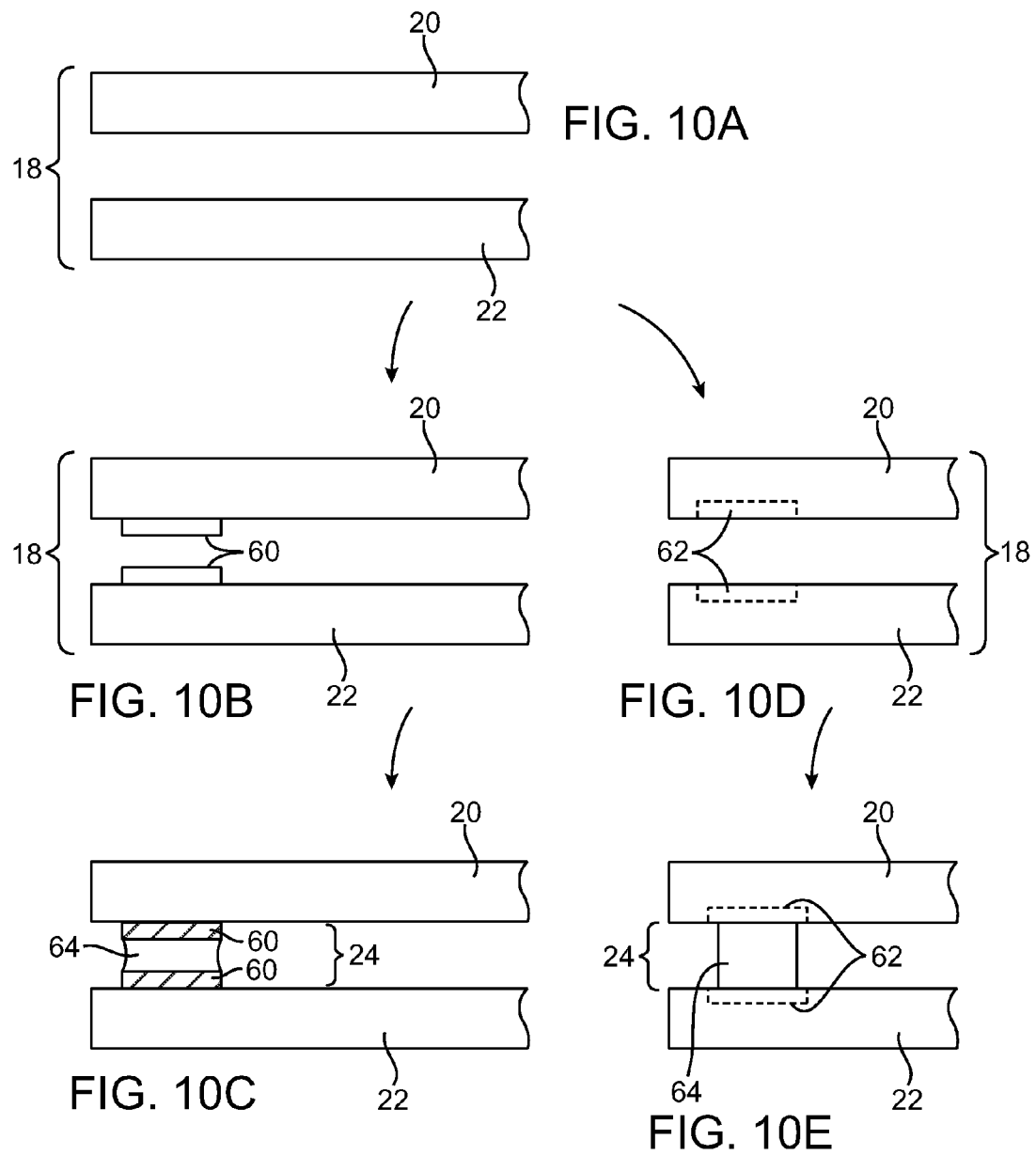

DISPLAY MODULES

This application claims the benefit of provisional patent application No. 61/225,870, filed Jul. 15, 2009, which is hereby incorporated by reference herein in its entirety.

BACKGROUND

This relates to electronic devices and, more particularly, to displays for electronic devices.

Electronic devices such as cellular telephones, handheld computers, and portable music players often include displays. A display generally contains an array of individually controllable pixels. Transistors such as thin-film transistor may be used in controlling the pixels. For example, in pixels that contain light-emitting diodes, the transistors may be used in controlling the light-emitting diodes and, in pixels that are based on liquid crystals, the transistors may be used in controlling the state of the liquid crystal material. Using arrangements such as these, pixels can be used to present visual information for a user.

Thin-film transistors and other materials for forming display pixels are typically formed on glass substrates. A glass substrate on which an array of thin-film transistors has been formed is sometimes referred to as a thin-film transistor (TFT) glass substrate or TFT glass.

An unsealed TFT glass substrate is vulnerable to damage from exposure to moisture and other environmental factors. As a result, a layer of encapsulation glass is used to encapsulate the components on the TFT glass.

With conventional arrangements, a peripheral seal between the TFT glass and encapsulation glass is formed using a glass frit (i.e., small particles that can be melted to form glass). The glass frit is placed around the perimeter of the TFT glass to surround the electrical structures on the TFT glass. The encapsulation glass is placed on top of the glass frit. Once the glass frit is sandwiched between the TFT glass and the encapsulation glass, a laser is used to melt the glass frit. The resulting encapsulated TFT glass forms a display module.

The melted frit forms a hermetic seal between the TFT glass and the encapsulation glass. The seal is suitable for preventing environmental intrusion into the sealed interior portion of the display module. However, conventional materials and processes for forming sealed display modules of this type may be unable to satisfactorily withstand damage when subjected to unintended impacts. It would therefore be desirable to be able to provide improved ways for forming display modules.

SUMMARY

Display modules and methods for forming display modules are provided. The display modules may include a thin-film transistor (TFT) glass substrate layer that includes thin-film transistors and other display components. These components may be sensitive to environmental exposure. A layer of encapsulation glass may be used to encapsulate the sensitive components. The TFT glass and encapsulation glass may be bonded using bond structures and bonding techniques that help minimize the likelihood of damage when an electronic device containing the display module is inadvertently dropped.

Bond structures may be used in forming a seal between the TFT glass and the encapsulation glass. Bond structures may be formed in a ring-shaped bond region that surrounds the periphery of the glass layers. Bond structures may be formed in a substantially rectangular ring shape.

Small glass pieces, known as frit, may be used to form bond structures. The frit may be polished or filtered to ensure that smooth polished frit of a certain size is used in the bond structures. Epoxy and other adhesives may also be used in the bond structures. Light-adsorbing materials may also be included in bond structures to facilitate laser melting during bond formation.

Display module damage such as damage from crack formation may arise from excessive stress in the glass layers when heat is applied to the periphery of the glass layers during bond formation. In order to reduce stress, a second heat source may be applied to the glass layers so that the glass layers are placed in an expanded state during bond formation. Tempering by heat or chemical treatment may also be used.

A solid gasket of bond material such as a ring-shaped gasket may be also used to form bond structures. The gasket may be formed from a ring of solid glass in addition to or instead of using loose frit material The gasket may have a substantially rectangular ring shape.

A raised ring-shaped surface may also be formed around the periphery of a glass layer using a material such as soda lime. The raised ring-shaped surface may be used in addition to or instead of using loose frit material.

Metal alloys may also be used to form bond structures. Adhesion promotion layers may be formed on the glass surfaces prior to the deposition of metal alloys.

Any of the bond structures may be annealed using a laser or other localized heat source.

Further features of the invention, its nature and various advantages will be more apparent from the accompanying drawings and the following detailed description of the preferred embodiments.

BRIEF DESCRIPTION OF THE DRAWINGS

FIGS. 10A-10E are diagrams showing how a metal alloy that may be used to bond glass layers in accordance with an embodiment of the present invention.

DETAILED DESCRIPTION

Figure 1:
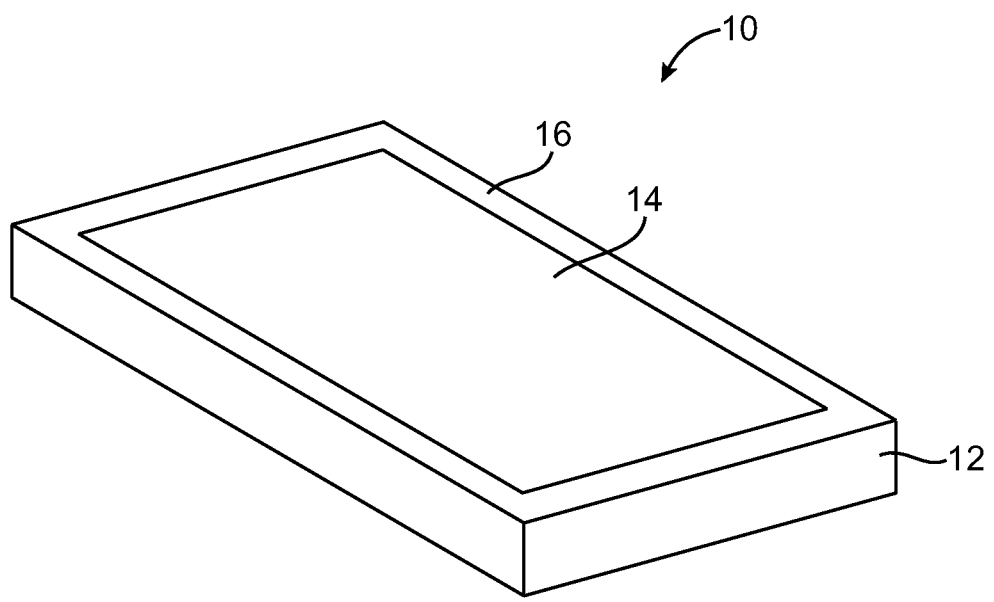
FIG. 1 is a diagram of an illustrative portable electronic device with a display in accordance with an embodiment of the present invention.

Electronic devices such as computers, handheld devices, computer monitors, televisions, cellular telephones, media players, and other equipment may have displays. An example is presented in FIG. 1. In the example of FIG. 1, device 10 is a portable device such as a portable media player, tablet computer, handheld electronic device, or cellular telephone. This is merely illustrative. Device 10 may, in general, be any suitable electronic device. The arrangement of FIG. 1 is an example.

As shown in FIG. 1, portable electronic device 10 may have housing 12. Housing 12, which is sometimes referred to as a case, may be formed from one or more individual structures. For example, housing 12 may have a main structural support member that is formed from a solid block of machined aluminum or other suitable metal. One or more additional structures may be connected to the housing 12. These structures may include, for example, internal frame members, external coverings such as sheets of metal, etc. Housing 12 and its associated components may, in general, be formed from any suitable materials such as plastic, ceramics, metal, glass, etc. Input-output ports such as an audio jack and data ports, user input interface components such as buttons and other input-output devices may be provided in housing 12.

A display such as display 14 may be mounted within housing 12. Display 14 may be, for example, a liquid crystal display (LCD), organic light emitting diode (OLED) display, or a plasma display (as examples). Touch sensor electrodes may be included in display 14 to provide display 14 with touch sensing capabilities (e.g., touch screen). Display 14 may contain a number of layers of material. These layers may include, for example, layers of optically transparent glass. Layers of plastic and optical adhesive may also be incorporated into display 14. A liquid crystal display may have layers of polarizer, light diffusing elements, light guides for backlight structures, and a liquid crystal layer. An organic light-emitting diode (OLED) display may have organic materials that are used in producing light.

An array of circuit components such as a thin-film transistor (TFT) array may be used to drive the image pixels in a display. This array of circuitry is generally formed on a substrate material such as glass. The substrate glass layer on which the thin-film transistors and/or other circuitry for the display are formed is therefore sometimes referred to as the TFT glass substrate or TFT glass.

The thin-film transistors and other circuitry on the TFT glass may be protected from environmental exposure by sealing the display with a layer of glass (sometimes referred to herein as encapsulation glass). Conductive traces such as indium-tin oxide (ITO) traces may be used to form capacitive electrodes for a touch sensor portion of display 14. The conductive traces may be formed on one or more sides of a glass layer in the display.

A display structure such as a TFT glass layer to which a layer of encapsulation glass has been attached forms a portion of display 14 and is therefore sometimes referred to herein as a display structure or display module.

As shown in FIG. 1, display 14 may be mounted in case 12 using a structure such as bezel 16. Bezel 16 may be formed from a portion of case 12 or a separate structure. Display mounting arrangements without visible bezels may also be used.

The TFT glass layer and encapsulation layer may be bonded together at their edges. There is generally a width associated with this bond region. To enhance the aesthetics of device 10, it may be desirable to ensure that the bond region width is not too large. This may help hide the bond region from view when display 14 is mounted in device 10 (e.g., behind bezel 16).

Although thin bond regions are desirable when bonding an encapsulation glass onto the surface of a TFT glass layer, bond regions that are too thin may make a display susceptible to damage. It is therefore desirable to provide display 14 with a durable and shock resistant bond.

Figure 2:
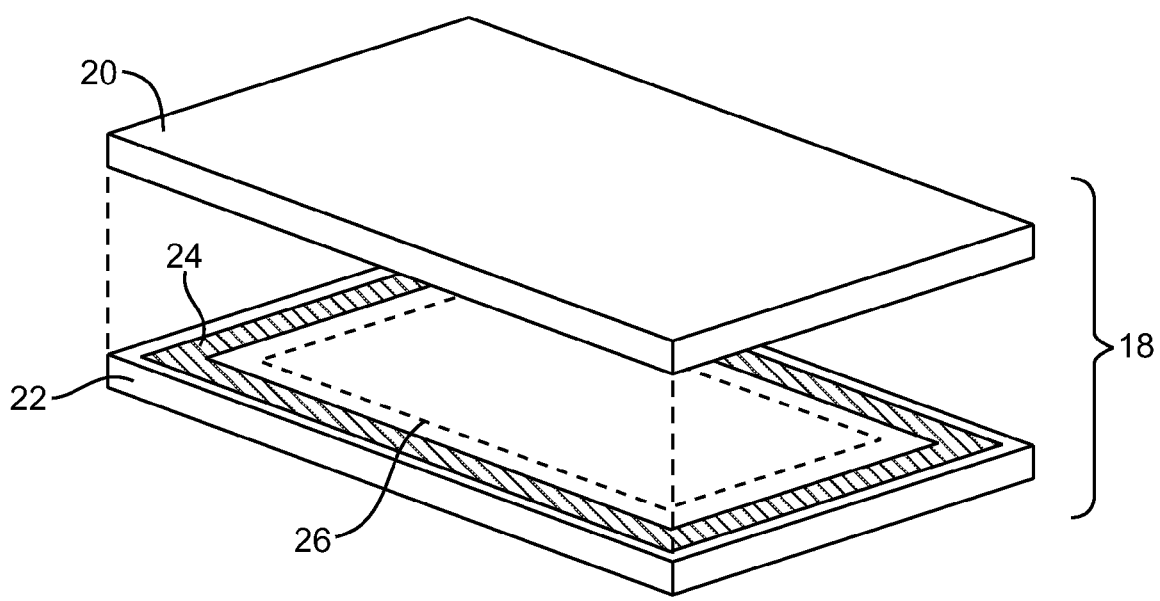
FIG. 2 is a perspective view of an illustrative display module in accordance with an embodiment of the present invention.

An exploded perspective view of an illustrative display module is shown in FIG. 2. As shown in FIG. 2, display module 18 may include layer 22 (i.e., a TFT glass substrate layer) and layer 20 (i.e., an encapsulation glass layer). Bond structures 24 may be used in forming a seal between encapsulation glass 20 and TFT glass 22. Bond structures 24 may be formed in a ring-shaped bond region that surrounds the periphery of layers 22 and 20 and thereby surrounds electrical components 26 such as thin-film transistors and other display pixel circuitry 26. Bond structures 24 may have a substantially rectangular ring shape. Display module 18 may form all or part of display 14 of FIG. 1.

Figure 3:
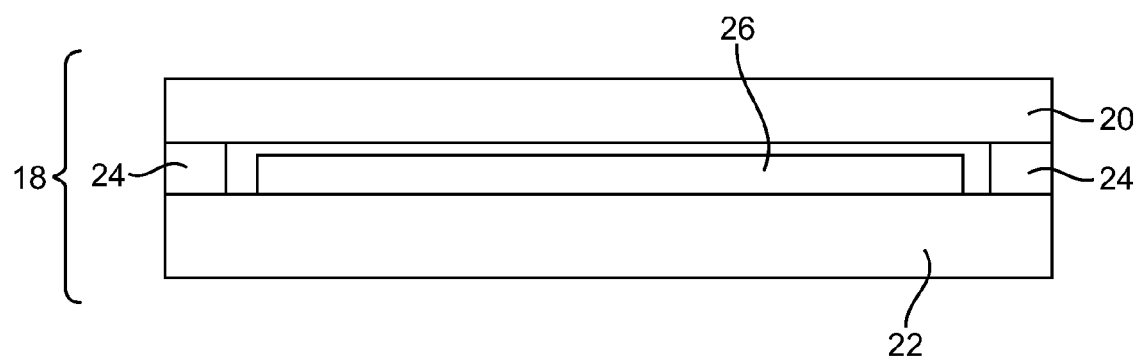
FIG. 3 is cross-sectional side view of an illustrative display module in accordance with an embodiment of the present invention.

A cross-sectional side view of display module 18 is shown in FIG. 3. As shown in FIG. 3, bond structures 24 may be used to form a hermetic seal around the periphery of electrical components 26. This prevents environmental intrusion into the interior of display module 18.

Bond structures 24 may be formed by placing a separate material or materials between glass layer 20 and 22. For example, bond structures 24 may include small pieces of glass. These glass pieces, which are sometimes referred to as glass frit or frit, may be exposed to heat so that they melt and form a glass seal for display module 18. Typical materials for forming frit include oxides. The identities of the constituent oxides in the frit and the relative amount of each oxide may be chosen so that the frit has a desired coefficient of thermal expansion. For example, the makeup of the frit may be chosen so that the coefficient of thermal expansion of bond structures 24 matches the coefficients of thermal expansion of layers 20 and 22.

If desired, bond structures 24 may include epoxy and other adhesives, metal alloys with relatively low melting points such as tin-based solder or lead-based solder, brass-based alloys for forming brazed joints (sometimes referred to as braze or braze alloys), bulk glass, raised portions of layers 20 and 22, adhesion promotion layers, treated surfaces and other treated structures, etc. Layers 20 and 22 may be formed from borosilicate glass, aluminosilicate glass, or other suitable glasses.

Figure 4:
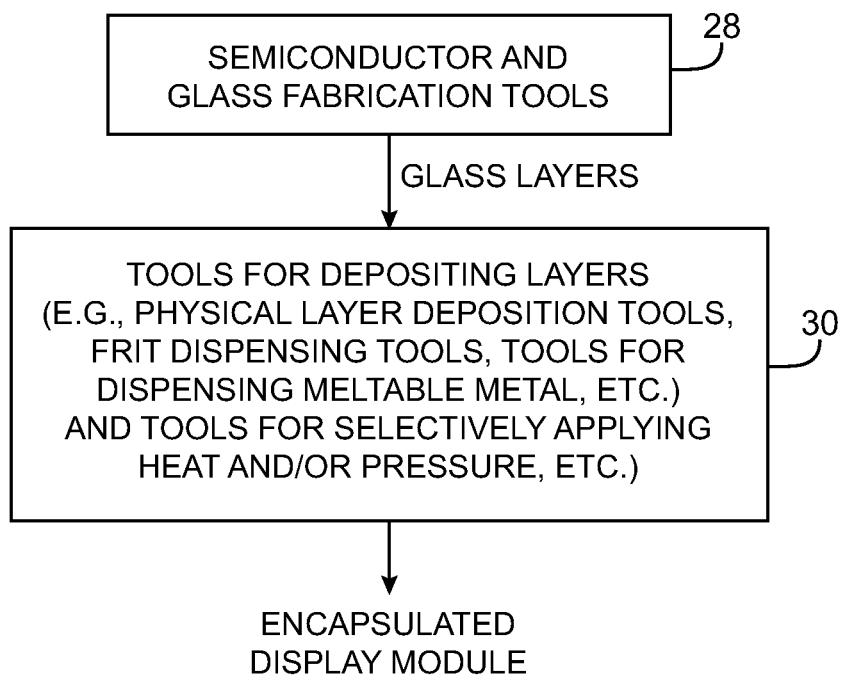
FIG. 4 is a flow chart showing illustrative equipment for forming display modules in accordance with an embodiment of the present invention.

Illustrative equipment for forming display module 18 of FIGS. 2 and 3 is shown in FIG. 4. As shown in FIG. 4, semiconductor and glass fabrication tools 28 may be used to form glass layers such as glass layers 20 and 22. Tools 28 may also be used to form electrical components such as thin-film transistors on TFT layer 22.

Tools 30 may be used in attaching encapsulation glass 20 to TFT glass 22. Tools 30 may include tools for depositing layers of material on glass layers such as physical layer deposition tools. Tools 30 may also include photolithography tools or other tools for patterning deposited materials.

Physical layer deposition tools in tools 30 may include sputtering tools, evaporation tools, and tools for depositing materials by spray-on techniques, spin-on techniques, and screen printing (as examples). These tools may be used to apply metals, metal alloys, dielectrics, polymers, glasses, semiconductors (e.g., conductive semiconductors such as ITO), other suitable materials, or combinations of these materials. Materials such as frit may be dispensed from a nozzle or may be applied to a glass layer using screen printing. To facilitate application by screen printing techniques, binders and liquid may be incorporated into the frit to ensure that the frit has the consistency of paste.

Tools 30 may include tools for applying other bond structure materials such as solder, braze, and other meltable metal alloys, tools for applying adhesive to the glass layers, tools for modifying the surface properties of the glass layers (e.g., by chemical treatment using a liquid or application of a chemical paste, by abrasion, ion bombardment, etc.), etc.

Bonds may be formed using self-curing materials such as epoxy that cures at room temperature. To ensure a high-quality bond that satisfactorily prevents environmental intrusion, epoxy bonds may be supplemented or replaced with bonds formed from glass and/or metal. These bonds may be formed by applying heat and/or pressure. For example, frit or other glass-based bond material may be melted by application of high pressure. Generally, heat or a combination of heat and pressure is used. Following bond formation, additional treatments may be applied. For example, after a glass frit has been melted to seal encapsulation glass 20 to TFT glass 22, an annealing operation may be performed on the melted frit layer.

Pressure may be applied by using mechanically positioned metal tooling (e.g., forms or other templates in which glass layers may be pressed together, particularly around their edges). Localized heat may be applied using a lamp (e.g., an infrared lamp), a laser (e.g., an infrared laser), a flame source, induction heating, a heated metal chuck or other metal structure (e.g., a heated press), or other suitable heat source. These localized heat sources may be mounted on an x-y translation stage (or display module 18 may be mounted on a stage) to allow the rate of translation and the position of the heat source relative to the structures of display module 18 to be controlled. By controlling the rate of translation and the power of the laser or other localized heat source, the rate of heating, the overall heating amount, and the rate of cooling after heating may be controlled. In addition to or as an alternative to local heating arrangements, heat may be applied globally to the glass layers and bonding structures. Heat may be applied globally using a furnace, a lamp, a heated chuck, etc.

Illustrative techniques that may be used in improving the quality of the bond formed by bond structures 24 and which may therefore help reduce the likelihood that display module 18 will become cracked or otherwise damaged when subjected to an inadvertent mechanical or thermal shock are described in connection with FIG. 5-13. Tools such as tools 30 of FIG. 4 may be used in forming bonds of the type described in connection with FIGS. 5-13.

One potential source of weakness in bond structures 24 when bond structures 24 are formed from melted frit is the nature of the frit particles. Conventional frit may, for example, have numerous sharp edges and a wide range of particle sizes, as shown in the upper left corner of FIG. 5. The irregular shapes and sizes of conventional frit may give rise to potential stress points when bond structures 24 are formed. For example, conventional frit may include a non-negligible number of large particles. These large particles may bear against a particular portion of a glass layer and may therefore produce localized stress. This localized stress in the glass may serve as an initiation point for subsequent crack formation.

Figure 5:
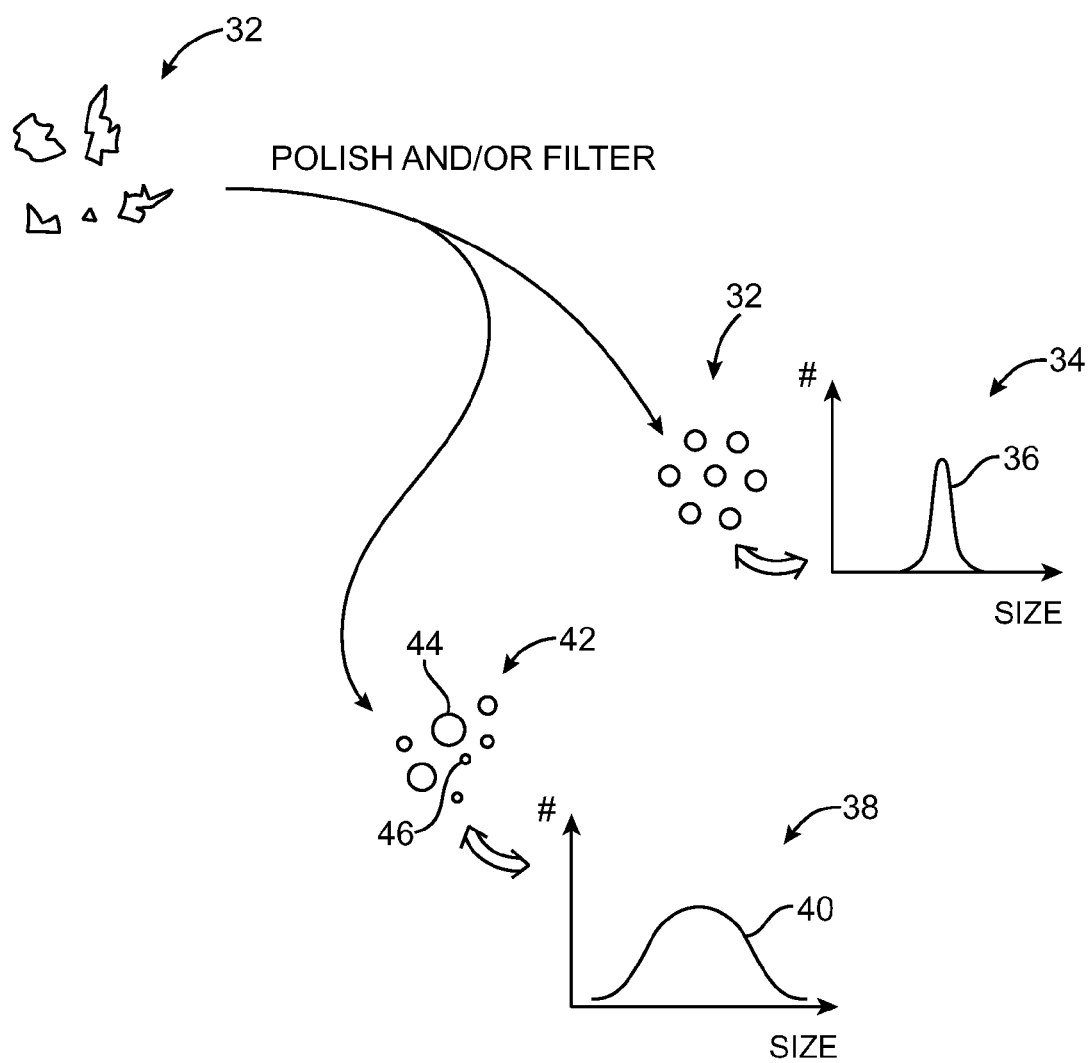
FIG. 5 is a diagram showing how frit particles may be polished in accordance with an embodiment of the present invention.
Figure 6:
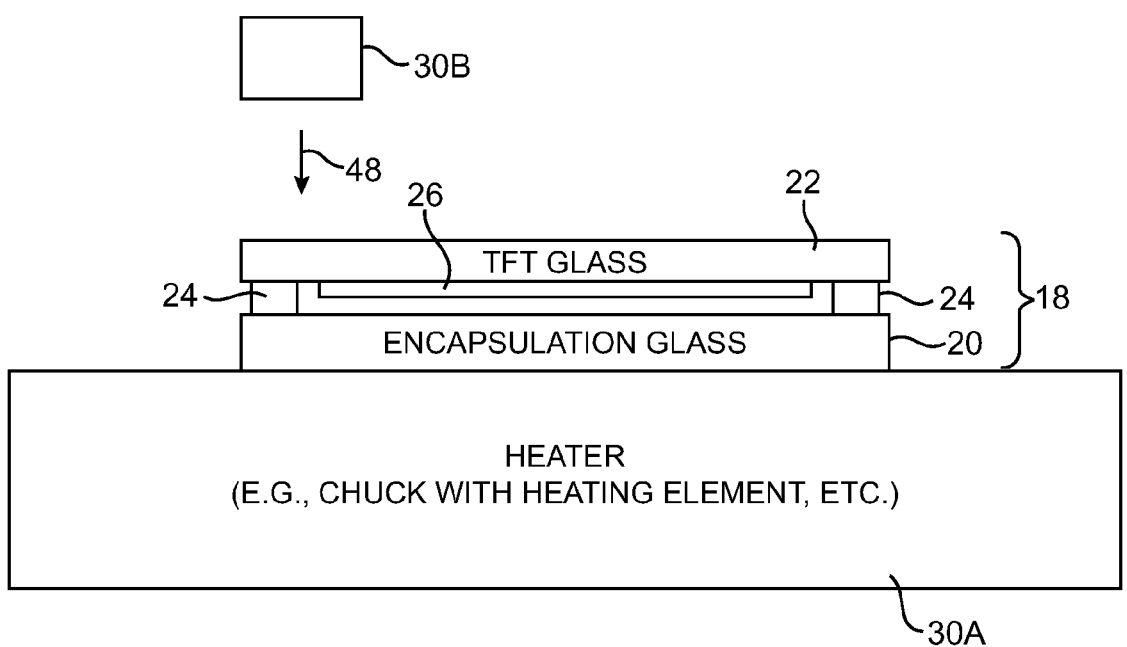
FIG. 6 is a diagram showing how a heat source may be used to heat a glass layer during bond formation in accordance with an embodiment of the present invention.

One way that the likelihood of localized stress formation may be reduced involves the use of smooth frit particles. As shown in FIG. 5, unprocessed frit 32 may be converted into processed frit 32 and 42. Unprocessed frit 32 may have jagged edges and a wide range of particle sizes. Frit 32 may be ground into smaller and more rounded particles such as particles 32 and 42 (e.g., using a grinding machine or other suitable polishing tool). A filtering tool may be used to sort the processed frit by size. For example, the filtering tool may be used to perform a binning operation in which frit is segregated into different groups (bins) based on frit diameter. A frit of a desired size may then be selected to use in forming bond structures 24. Using this type of approach, the filtering tool may be used to produce processed frit with a relatively narrow range of frit diameters or processed frit with a relatively wide range of frit diameters.

As shown in the upper right portion of FIG. 5, processed frit 32 may, for example, be formed from smooth (rounded) frit particles having a relatively narrow particle size distribution (shown by narrow particle diameter distribution curve 36 in particle diameter distribution graph 34). As shown in the example of the lower right portion of FIG. 5, processed frit 42 may have rounded particles of a variety of diameters including large diameter particles such as large particle 44 and small diameter particles such as small particle 46. The relatively wide range of frit particle diameters in processed frit 42 is evidenced by the relatively wide particle size distribution curve 40 of particle diameter distribution graph 38.

Because processed frit particles such as particles 32 and 42 are rounder and therefore smoother than unprocessed frit particles 32, processed frit 32 and 42 may be less likely than unprocessed frit to produce localized stress in a frit bond. The uniform size of frit 32 may also help to reduce stress by removing larger particles that could press against a glass layer. Processed frit with a relatively wide range of particle sizes may be advantageous in reducing stresses that might arise from voids between particles. This is because the smaller particles in frit 42 may fill interstitial gaps between the larger particles in frit 42. If desired, other materials (e.g., melting metal alloys, non-oxide dielectric fillers, etc.) may be used to help fill voids and reduce stress formation.

Frit such a processed frit 32 and 42 and the other materials used to form bonding structures 24 may include light-absorbing materials. These light-absorbing materials may facilitate laser melting during bond formation.

Display module damage such as damage from crack formation may arise from excessive stress (i.e., tensile stress) in the glass layers 20 and 22 in the vicinity of bond structures 24. This may be addressed by heating one or more of the glass layers during bond formation. For example, a heat source such as heater 30A of FIG. 6 may be used to heat encapsulation glass 20 before light 48 is applied to the frit of bond structures 24 from laser 30B. This type of arrangement may be used to heat encapsulation glass 20 to a temperature that is significantly above room temperature (e.g., above 50° C., 100° C., 200° C., 400° C., or higher), but that is sufficiently low to avoid damage to components in display module 18 such as thin-film transistors and other circuitry 26 on TFT glass 22. By preheating encapsulation glass 20 (and/or TFT glass 22) in this way, the heated glass is placed in an expanded state during bond formation. Following bond formation, the heated glass layer (e.g., encapsulation layer 20) is cooled. Because the encapsulation glass contracts as its cools, the encapsulation glass and the glass formed by melting the frit contract at substantially the same time. Because both the encapsulation glass and frit shrink together, situations in which the frit contracts more than the encapsulation glass and thereby generates undesired tensile stress in encapsulation glass can be avoided.

In some cases, instead of heating the entire surface, the glass layer may be selectively heated at a portion of the surface as, for example, around the perimeter in the region of the seal. Additionally or alternatively, the side edge of the glass layer may be heated.

It should be appreciated that the temperature may be controlled through the process. For example, the temperature may be adjusted at different times during the process to help control thermal issues.

If desired, all or part of the glass layers in display module 18 may be tempered. During tempering, the surface of the glass layer is placed in compressive stress. This may help prevent crack formation during subsequent impact events.

Tempering may be performed by localized heating (e.g., using a laser) or by chemical treatment. With one illustrative chemical treatment arrangement, a glass layer is coated with a potassium-based paste and is subjected to elevated temperatures. During this chemical tempering process, relatively small sodium ions in the glass are replaced with relatively large potassium ions from the potassium material. This places the surface of the glass that contains the potassium into a compressive stress condition and thereby chemically tempers the glass.

Figure 7:
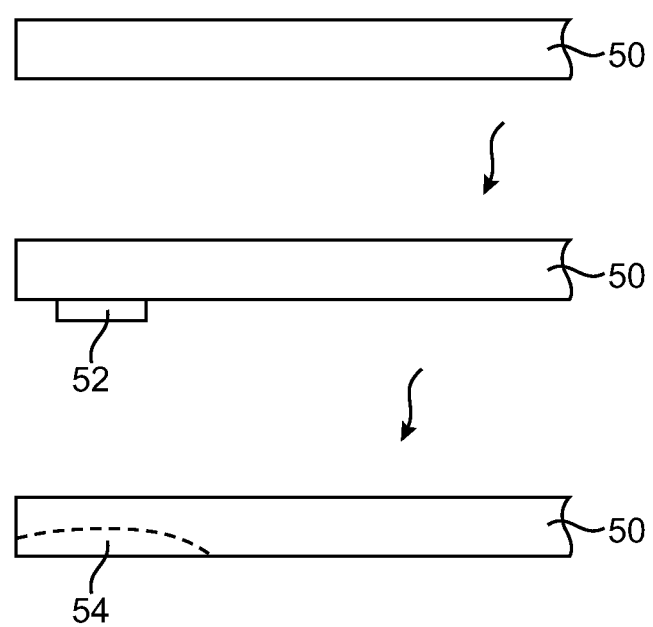
FIG. 7 is a diagram showing illustrative tempering of a glass layer in accordance with an embodiment of the present invention.

This type of approach is shown in FIG. 7. Initially, glass layer 50 is untreated, as shown in the upper portion of FIG. 7. Glass layer 50 in FIG. 7 represents glass encapsulation glass 20 and/or TFT glass 22. As shown in the middle portion of FIG. 7, untreated glass 50 may be coated with tempering material 52 (e.g., a potassium paste). Material 52 may, for example, be placed in a ring shape around the periphery of glass 50. After heat treatment at an elevated temperature, the potassium or other chemical tempering material may diffuse into the surface of glass 50, to form tempered region 54. Because tempered region 54 is under compressive stress, tempered region 54 is less likely to suffer damage when glass 50 is subjected to unexpected shocks. Localized chemical tempering in the vicinity of bond structures 24 may be used in conjunction with other bond formation processes (e.g., frit processing, encapsulation layer pre-heating, etc.) before and/or during these other bond formation processes. For example, potassium-based material may be incorporated into a frit paste so that tempering occurs during the frit melting process. Although only one side is shown, it should be appreciated that both pieces of glass can be selectively or totally tempered depending on the needs of the assembly.

Figure 8A:
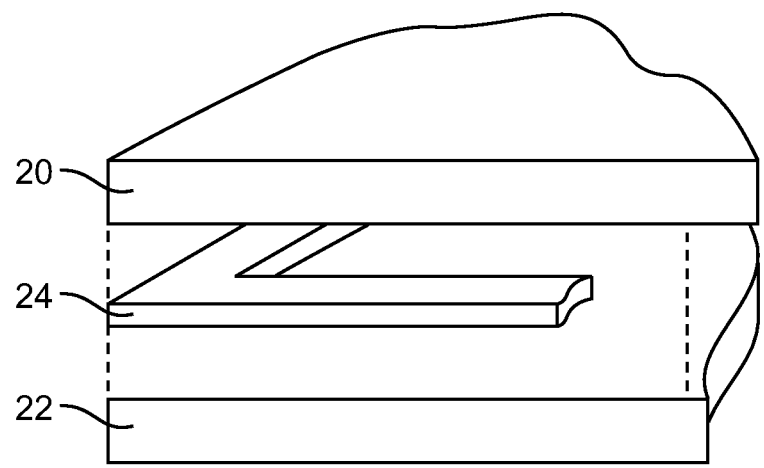
FIGS. 8A and 8B are diagrams showing how a solid gasket of bond material may be used to form bond materials in accordance with an embodiment of the present invention.
Figure 8B:
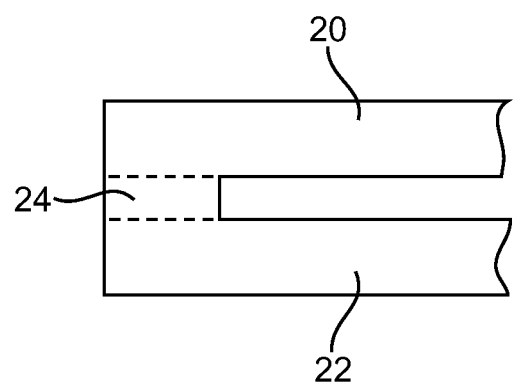

As shown in FIGS. 8A and 8B, a solid gasket of bond material such as ring-shaped gasket 24 may be used to form bond structures 24. Gasket 24 may be formed from a hoop (ring) of solid glass (in addition to or instead of using loose frit material). Gasket 24 may have a substantially rectangular ring shape. The glass in the ring structure may, for example, be formed from the same type of material as glass 20 and/or glass 22. As shown in FIG. 8A, glass ring 24 may be configured to form a seal around the periphery of glass layers 20 and 22. Following application of pressure and/or heat using tools 30, the glass of ring 24 fuses with the glass of layers 20 and 22 and forms a bond (shown as bond 24 in the cross-sectional view of FIG. 8B). The glass ring may be tempered using chemicals and/or heat.

If desired, glass layers such as layers 20 and/or 22 may be provided with raised ring-shaped surfaces. The raised ring-shaped surface may be used to help form bonding structure 24. An illustrative approach for bonding glass layers 20 and 22 using a raised glass surface arrangement is shown in FIGS. 9A-9G.

Figure 9A:
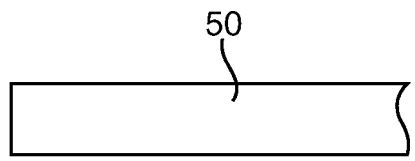
FIGS. 9A-9G are diagrams showing an illustrative approach for bonding glass layers using a raised surface arrangement in accordance with an embodiment of the present invention.
Figure 9B:
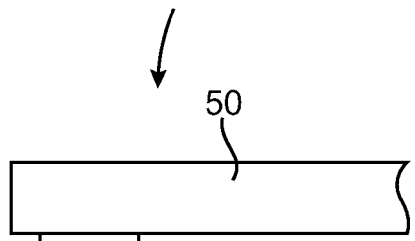
Figure 9C:

An untreated glass layer 50 (i.e., TFT glass 22 and/or encapsulation glass 20) is shown in FIG. 9A. As shown in FIG. 9B, glass layer 50 may be coated around its periphery with a layer of glass forming material 56 such as soda lime. Following heat treatment, the material 56 forms raised glass portion 58 on layer 50, as shown in FIG. 9C.

Figure 9D:
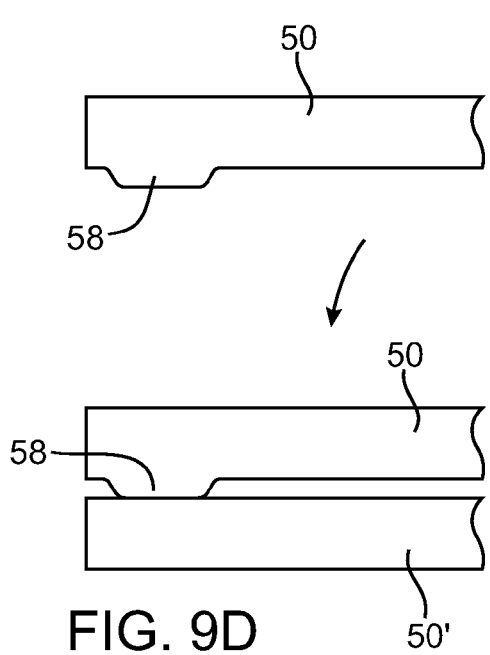

FIG. 9D shows how layer 50 and its raised portion 58 may be placed on top of a mating layer 50'. If layer 50 is a TFT layer, layer 50' may be an encapsulation layer. If layer 50 is an encapsulation layer, layer 50' may be a TFT layer.

Figure 9F:
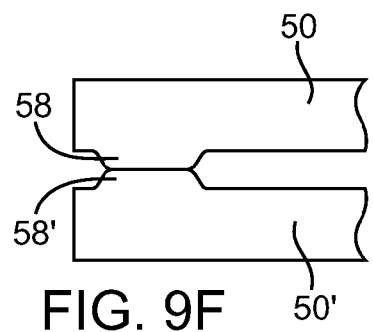
Figure 9E:
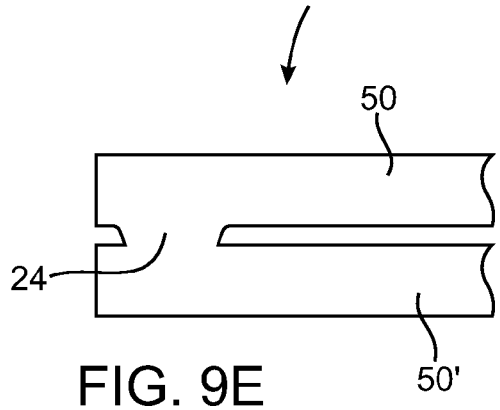

By application of heat and/or pressure, raised portion 58 forms a diffusion bond with layer 50' (i.e., layers 50 and 50' fuse together to form bond structure 24 of FIG. 9E).

Figure 9G:
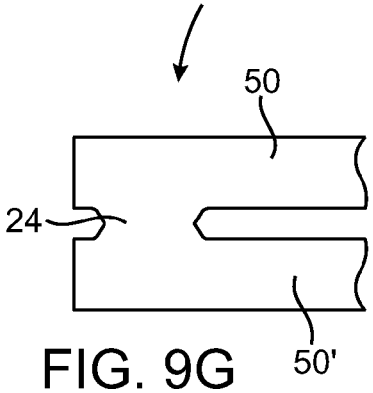

In the arrangement shown in FIGS. 9F and 9G, both upper layer 50 and mating lower layer 50' have raised portions formed from glass forming materials. During the bond formation process illustrated in FIG. 9F, regions 58 and 58' are subjected to pressure and/or heat. This forms a diffusion bond between layers 50 and 50' (shown as bonding structure 24 in FIG. 9G).

In another embodiment (not shown), a frit material and/or a solid glass ring may be disposed between one or both raised areas to help facilitate formation of a proper seal.

As shown in FIGS. 10A-10E, TFT glass 22 and encapsulation glass 20 may be bonded using a melted metal alloy such as metal alloy 64. Metal alloy 64 may be a lead-based solder, a tin-based solder or other non-lead-based solder, a brass-based melting metal alloy, or other suitable meltable metal alloy.

As shown in FIG. 10A, layers 20 and 22 are initially not bonded. To ensure satisfactory adhesion between metal alloy 64 and the glass of layers 20 and 22, an adhesion promotion surface may be created.

In the example of FIG. 10B, an adhesion promoting surface has been created by depositing adhesion promotion layers 60 on the surfaces of glass layers 20 and 22 in the vicinity of the bond region. Adhesion promotion layers 60 may be formed from a material that bonds well to glass and that provide a high-adhesion platform for subsequent deposition of metal alloy 64. As an example, adhesion promotion layers 60 may be formed from indium-tin oxide (ITO) traces or adhesion promoting metal traces. Metal alloy 64 may then be placed between layers 60 and melted to form bond structures 24 (FIG. 10C).

In the example of FIG. 10D, adhesion promotion surfaces 62 have been created by treating surface regions 62 of glass layers 20 and 22 with chemicals and/or physical treatments such as ion bombardment, etc. This allows metal alloy 64 to adhere properly between layers 60 following melting to form bond structures 24 (FIG. 10E).

Any of the bond structures that are formed may be annealed using a laser or other localized heat source or using a more global heat source. During annealing operations, stress that might lead to cracks may be released from the glass layers and bond structures. Global annealing operations may be performed using a furnace, an induction heater, a heated chuck or other fixture, a lamp or laser, etc. Local annealing operations may be performed using a laser, a lamp, induction heating equipment, a heated fixture (e.g., a fixture that applies heat to the perimeter of the display module by clamping the display module between respective heated metal parts), etc.

Figure 11:
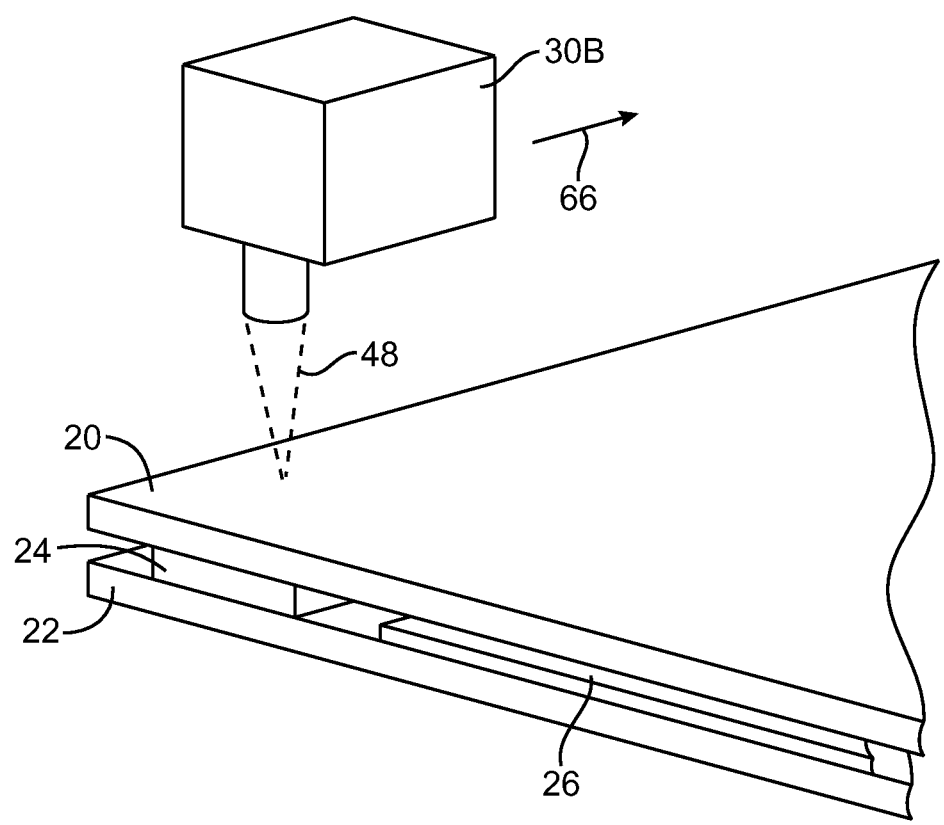
FIG. 11 is a diagram showing how a localized application of heat may be used for annealing in accordance with an embodiment of the present invention.

Localized application of pressure and/or heat during the formation of bond structures 24 may help prevent damage to sensitive components such as thin-film transistors. As shown in FIG. 11, heat for annealing and/or bond formation may be applied locally (i.e., in the vicinity of bond structure 24) using laser 30B. Laser 30B may be translated in direction 66. Light beam 48 may be an infrared laser light beam and may be focused onto bond structures 24 as shown in FIG. 11. Glass layers 20 and 22 may be transparent to infrared light, which allows most of the power from laser 30B to be absorbed in the frit or other material that is used in forming bond structures 24 (e.g., a solid glass gasket). The material of bond structures 24 may include light-absorbing components to facilitate infrared laser light absorption.

Figure 12:
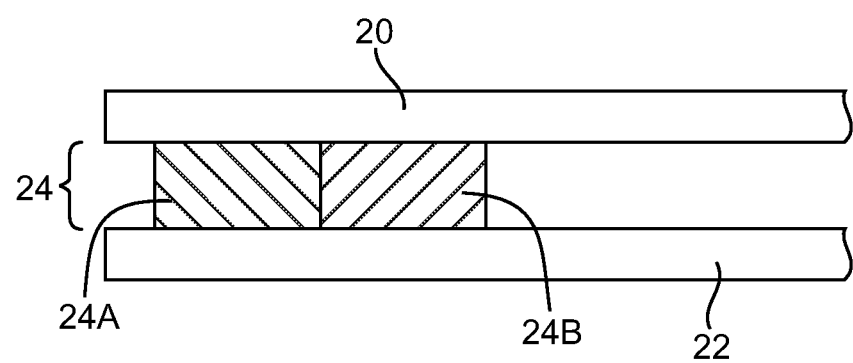
FIG. 12 is a diagram showing how bond structures may be formed from multiple adjacent materials or structures in accordance with an embodiment of the present invention.

FIG. 12 shows how bond structures 24 may be formed from multiple adjacent materials or structures. For example, bond structures 24 may be formed by a frit or metal alloy bond material 24A. Adjacent structure 24B may be composed of a different material (e.g., a different metal, a different dielectric, an adhesive, a polymer, etc.).

Figure 13:
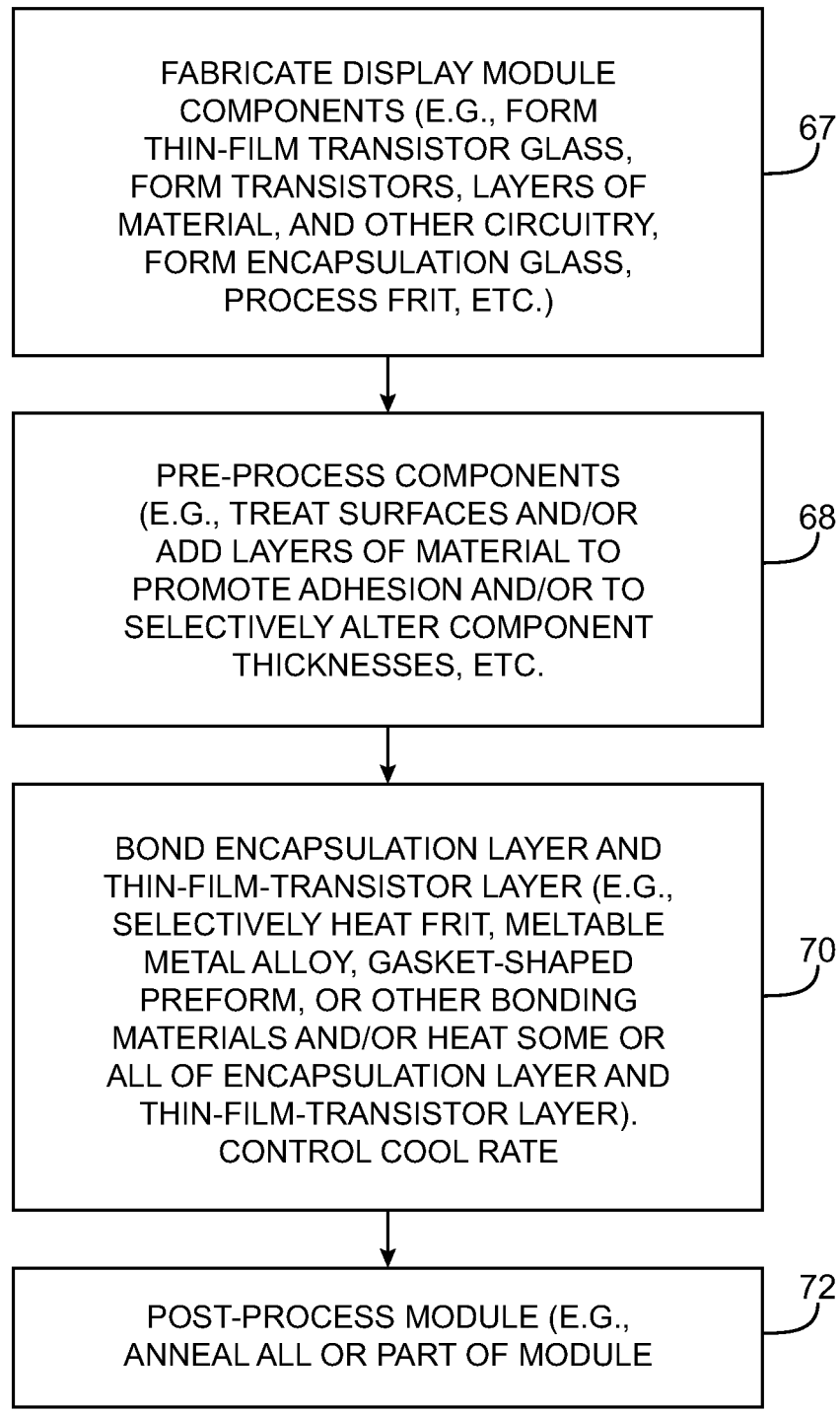
FIG. 13 is a flow chart showing illustrative steps in forming a display module from glass layers in accordance with an embodiment of the present invention.

Illustrative steps involved in forming display module 18 from glass layers 20 and 22 are shown in FIG. 13.

At step 67, components for display module 18 may be fabricated. These components may include TFT glass 22 and encapsulation glass 20. Thin-film transistors and other circuitry 26 may be formed on TFT glass 22. Organic layers may be formed in circuitry 26 for use in OLED display modules 18. If frit is to be used in forming bond structures 24, the frit may be processed as described in connection with FIG. 5.

At step 68, the components that were formed during the operations of step 67 may be pre-processed. Examples of preprocessing operations that may be performed include adhesion promotion operations such as operations to form ITO traces or adhesion promotion surfaces, operations to preheat encapsulation glass 20 (and/or glass 22), and operations to selectively increase the thickness of glass layer 20 and/or 22 in the vicinity of the bond region as described in connection with FIGS. 9A-9G.

After performing desired pre-processing operations in step 68, encapsulation glass 20 may be bonded to TFT substrate glass 22. Bond formation operations may involve localized heating (e.g., by directing laser light or other light onto the bond region or otherwise using a localized heat source to heat up the bond). Bond formation operations may also involve the application of pressure. For example, the periphery of glass layers 20 and 22 may be pressed together using a metal press. Combinations of heat and pressure may also be used.

The material that is used in forming bond structures 24 may be glass frit, a ring-shaped glass gasket, raised glass regions that form an integral portion of glass layers 20 and 22, a meltable metal alloy, other suitable bond materials, or any suitable combination of these bond structure materials. The heating rate and the cooling rate of the bond may be controlled. For example, the cooling rate may be slowed sufficiently to allow for simultaneous bond formation and annealing.

Annealing and other post-processing operations may also be performed during one or more separate operations. These optional operations are illustrated as post-processing operations 72. Annealing may be used to relieve built-up stress (e.g., built-up tensile stress in glass layers 20 and 22) that might otherwise make module 18 susceptible to damage.

The foregoing is merely illustrative of the principles of this invention and various modifications can be made by those skilled in the art without departing from the scope and spirit of the invention.

What is claimed is:

1. A method for forming a display module, comprising:
    forming an integral ring-shaped raised ridge around a peripheral portion in a first layer of glass on which electrical components are formed;
    bonding a second layer of glass to the integral raised ridge in the first layer of glass to encapsulate the electrical components, comprising:
        applying localized heat from a first heat source to the integral raised ridge in the first layer of glass; and
        applying global heat from a second heat source to all of the first layer of glass.

2. A method for forming a display module, comprising:
    forming an integral ring-shaped raised ridge using soda lime around a peripheral portion in a first layer of glass on which electrical components are formed; and
    bonding a second layer of glass to the integral raised ridge in the first layer of glass to encapsulate the electrical components.

3. The method defined in claim 1, further comprising forming an integral ring-shaped raised ridge around a peripheral portion in the second layer of glass that mates with the integral ring-shaped raised ridge in the first layer of glass.

4. The method defined in claim 1 further comprising tempering the first layer of glass.

5. The method defined in claim 1 further comprising annealing the first and second layers of glass.

6. The method defined in claim 2, further comprising:
    processing a glass frit formed of frit particles having edges to smooth the edges; and
    depositing the glass frit around the periphery of the first layer of glass, and wherein bonding the second layer of glass to the integral raised ridge in the first layer of glass comprises:
        applying light to the glass frit; and
        before applying the light to the glass frit, heating an area of the second layer of glass that does not contact the glass frit using a heating element that contacts the area of the second layer of glass.

7. The method in claim 2, further comprising bonding a solid ring-shaped gasket between the first and second layers of glass.

8. The method defined in claim 2, further comprising filtering the glass frit by frit diameter before depositing the glass frit.

9. The method of claim 2 further comprising tempering the first layer of glass by coating the first layer of glass with a potassium-based paste and applying heat to the first layer of glass.

10. The method in claim 2, wherein heating the area of the second layer of glass that does not contact the frit further comprises heating the area of the second layer of glass with a heated chuck.

11. The method in claim 2, further comprising cooling the second layer of glass.

* * * * *